(12) United States Patent
Zhang et al.

(10) Patent No.: US 11,841,829 B2
(45) Date of Patent: Dec. 12, 2023

(54) CONTENT-BASED DYNAMIC HYBRID DATA COMPRESSION

(71) Applicant: Dell Products L.P., Round Rock, TX (US)

(72) Inventors: Xiao Na Zhang, Shanghai (CN); Dong Liang Huang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 311 days.

(21) Appl. No.: 17/383,555

(22) Filed: Jul. 23, 2021

(65) Prior Publication Data

US 2022/0382717 A1 Dec. 1, 2022

(30) Foreign Application Priority Data

May 25, 2021 (CN) .......................... 202110571311.3

(51) Int. Cl.
*H03M 7/30* (2006.01)
*G06F 16/174* (2019.01)
*G06N 20/00* (2019.01)

(52) U.S. Cl.
CPC ......... *G06F 16/1744* (2019.01); *G06N 20/00* (2019.01); *H03M 7/3064* (2013.01); *H03M 7/3071* (2013.01); *H03M 7/6064* (2013.01)

(58) Field of Classification Search
CPC .... H03M 7/30; H03M 7/3088; H03M 7/3079; H03M 7/3086; H03M 7/40; H03M 13/00; H03M 13/6312; H03M 7/4006; H03M 7/46; H03M 7/6064; H03M 7/607; H03M 7/6088; H03M 7/6094; H03M 7/3059; H03M 7/3084; H03M 7/6076; H03M 7/6082
USPC .................................... 341/51, 87, 106, 107
See application file for complete search history.

(56) References Cited

U.S. PATENT DOCUMENTS

| | | | | |
|---|---|---|---|---|
| 6,154,572 A | * | 11/2000 | Chaddha | H04N 19/147 375/E7.265 |
| 6,195,024 B1 | * | 2/2001 | Fallon | G06T 9/00 341/51 |
| 6,489,902 B2 | * | 12/2002 | Heath | H03M 7/3088 341/87 |

(Continued)

*Primary Examiner* — Linh V Nguyen
(74) *Attorney, Agent, or Firm* — Larson Newman, LLP

(57) ABSTRACT

An information handling system includes a processor configured to process a training data file to determine an optimal data compression algorithm. The processor may also perform a compression ratio analysis that includes compressing the training data file using data compression algorithms, calculating a compression ratio associated with each of the data compression algorithms, determining an optimal compression ratio from the compression ratio associated with the each data compression algorithm; and determining a desirable data compression algorithm associated with the training data file based on the optimal compression ratio. The processor may also perform a probability analysis that includes generating a symbol transition matrix based on the desirable data compression algorithm, extracting statistical feature data based on the symbol transition matrix, and generating probability matrices based on the statistical feature data to determine the optimal data compression algorithm for each segment of a working data file.

20 Claims, 11 Drawing Sheets

(56) References Cited

U.S. PATENT DOCUMENTS

| | | | |
|---|---|---|---|
| 6,601,104 B1* | 7/2003 | Fallon | H04N 19/176 709/231 |
| 6,661,839 B1* | 12/2003 | Ishida | G01R 31/31921 375/240 |
| 6,885,319 B2* | 4/2005 | Geiger | H04N 19/61 341/51 |
| 10,749,546 B1 | 8/2020 | Sun et al. | |
| 2002/0097172 A1* | 7/2002 | Fallon | H03M 7/4006 341/51 |
| 2015/0331631 A1 | 11/2015 | McCarty et al. | |
| 2021/0011644 A1 | 1/2021 | Ippatapu | |
| 2021/0344549 A1* | 11/2021 | Babington | H03M 7/6011 |
| 2022/0092031 A1* | 3/2022 | Zhou | G06N 5/01 |
| 2022/0131556 A1* | 4/2022 | Teixeira De Abreu Pinho | G06F 18/214 |
| 2023/0253074 A1* | 8/2023 | Chandak | G16B 50/50 702/19 |

* cited by examiner

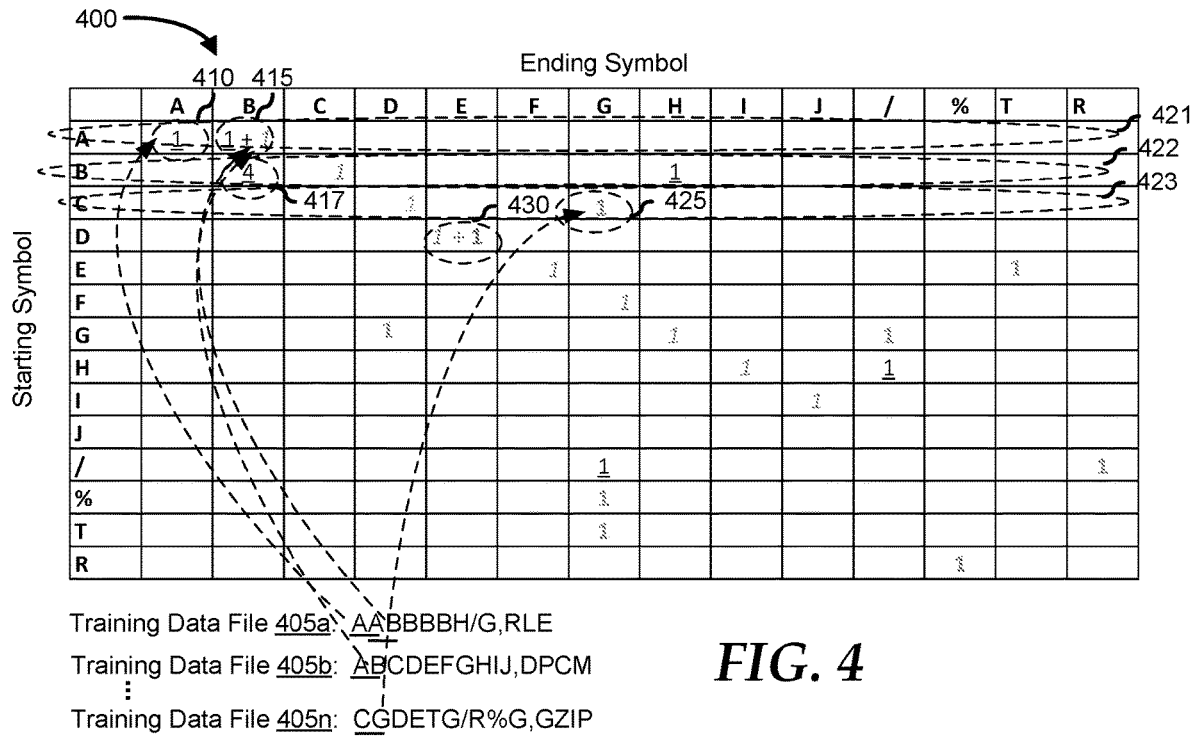
FIG. 4
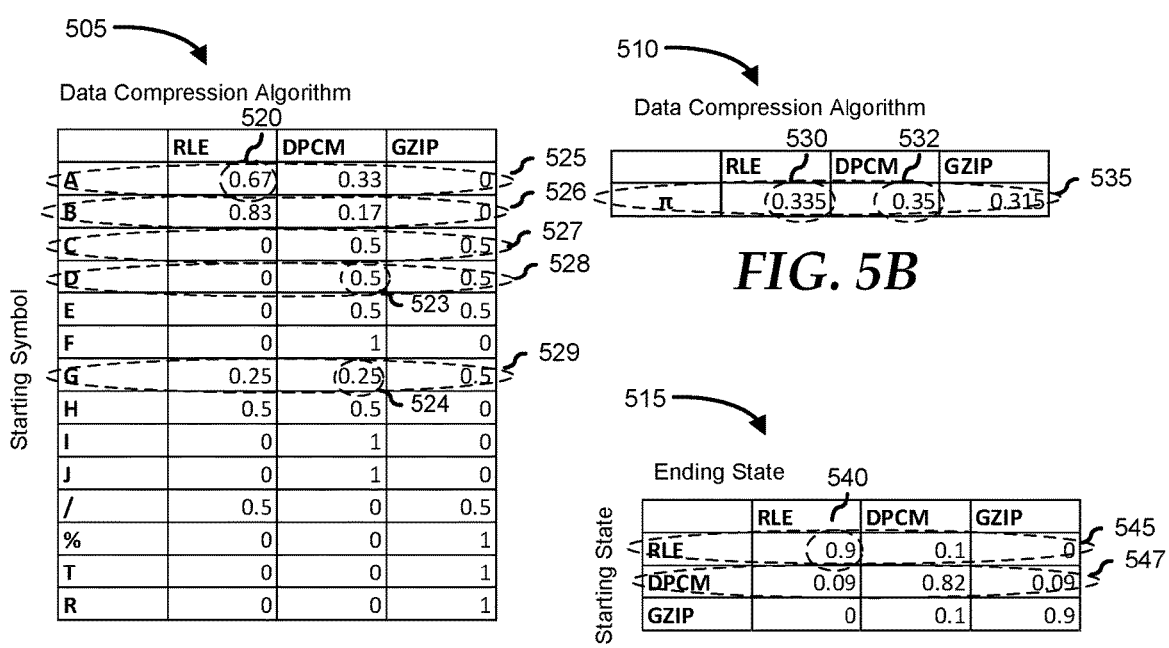
FIG. 5A
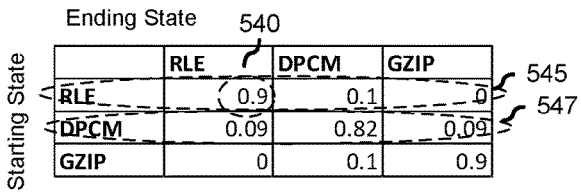
FIG. 5B
FIG. 5C

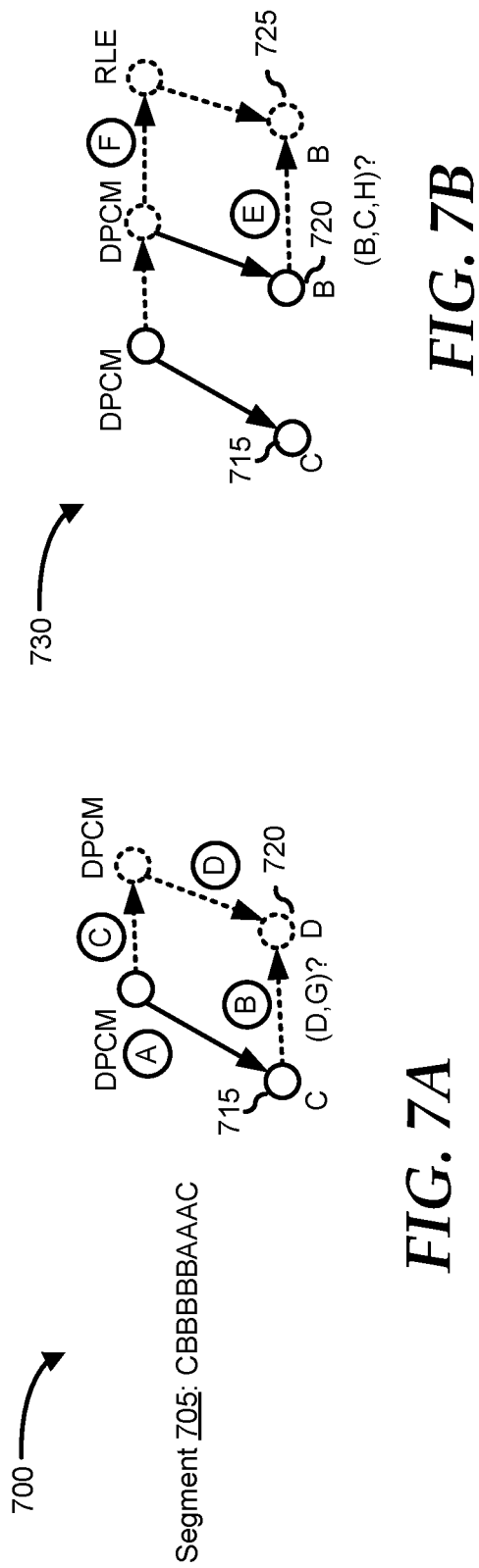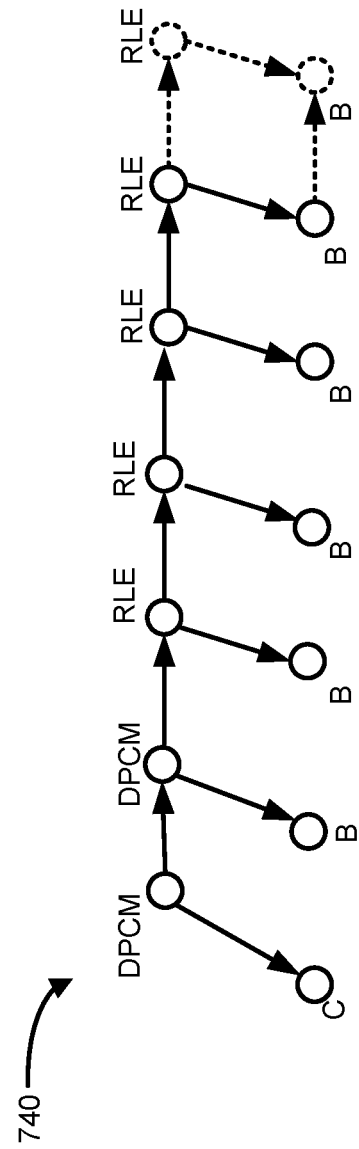
FIG. 7A
FIG. 7B
FIG. 7C

CONTENT-BASED DYNAMIC HYBRID DATA COMPRESSION

FIELD OF THE DISCLOSURE

The present disclosure generally relates to information handling systems, and more particularly relates to content-based dynamic hybrid data compression.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a processor configured to process a training data file to determine an optimal data compression algorithm. The processor may also perform a compression ratio analysis that includes compressing the training data file using data compression algorithms, calculating a compression ratio associated with each of the data compression algorithms, determining an optimal compression ratio from the compression ratio associated with the each data compression algorithm; and determining a desirable data compression algorithm associated with the training data file based on the optimal compression ratio. The processor may also perform a probability analysis that includes generating a symbol transition matrix based on the desirable data compression algorithm, extracting statistical feature data based on the symbol transition matrix, and generating probability matrices based on the statistical feature data to determine the optimal data compression algorithm for each segment of a working data file.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 4 illustrates an example of a construction of a symbol transition matrix, according to an embodiment of the present disclosure;

FIG. 5A illustrates an example of an observation probability matrix, according to an embodiment of the present disclosure;

FIG. 5B illustrates an example of an initial state distribution matrix, according to an embodiment of the present disclosure;

FIG. 5C illustrates an example of a state transition probability matrix, according to an embodiment of the present disclosure;

FIGS. 7A, 7B, 7C, 7D, and 7E show examples of state sequences generated during a working mode for content-based dynamic hybrid compression, according to an embodiment of the present disclosure;

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
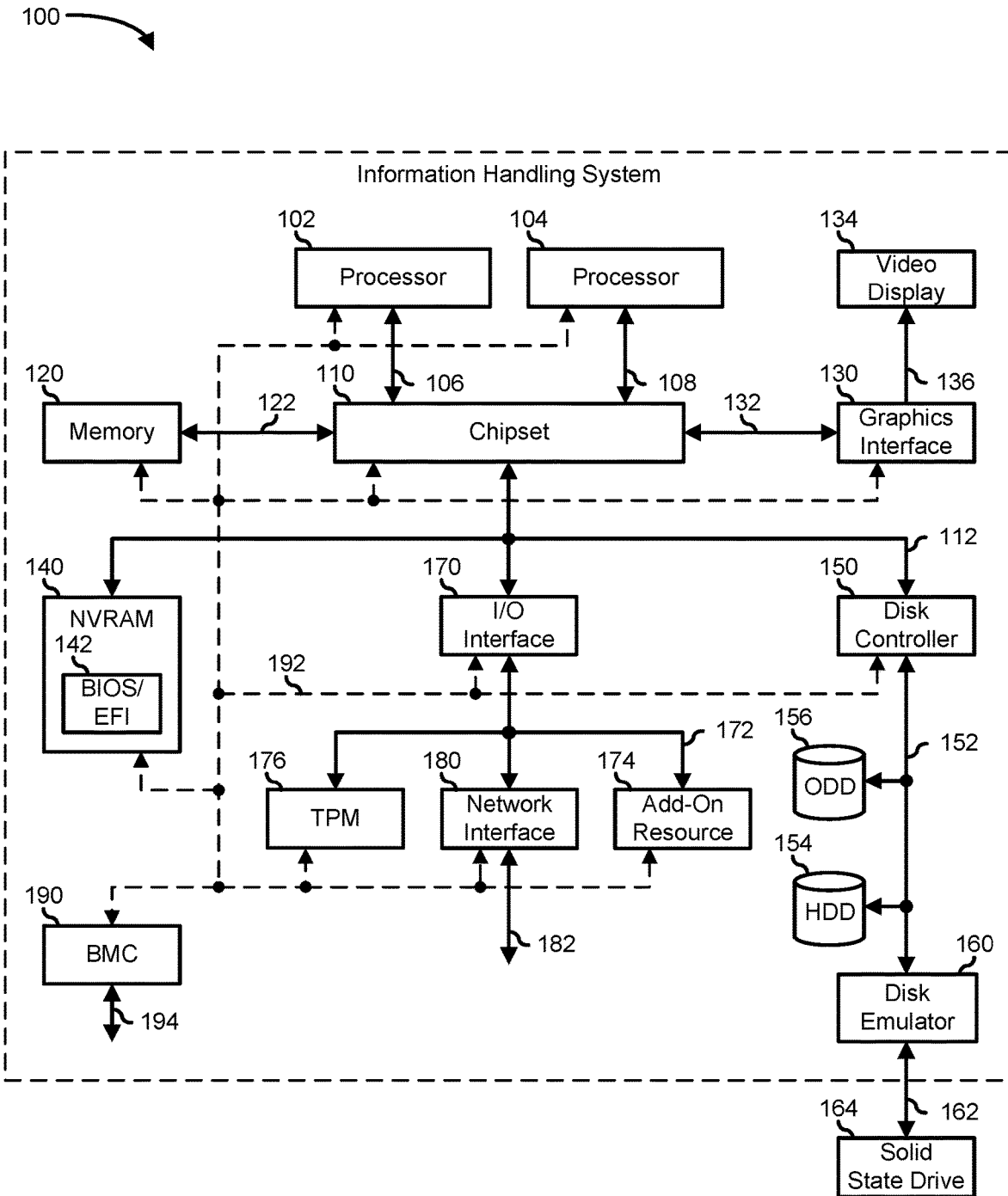
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random-Access Memory (DRAM) DIMMs, Static Random-Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four-lane (×4) PCIe adapter, an eight-lane (×8) PCIe adapter, a 16-lane (×16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out-of-band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

Applications typically transfer data via uncompressed data files such as HyperText Markup Language (HTML), Extensible Markup Language (XML), telemetry, logs, manifest files, etc. between a client and server. Various data compression algorithms are used to reduce resources to store and/or transmit data. These data compression algorithms may be classified as lossless or lossy. Lossless compression can be reversed to yield the original data while lossy compression may introduce some error on reversal. Lossless compression is typically used for textual data while lossy compression may be used for voice or images where some error may be acceptable. Various metrics such as compression ratio and speed may be used to rate a data compression algorithm's performance. The best data compression algorithm may help with reducing the network bandwidth when transferring files between the client and the server and in reducing the data storage requirements. The present disclosure provides a content-based dynamic hybrid data compression system and method with the ability to choose an optimal data compression to achieve the best compression quickly.

Figure 2:
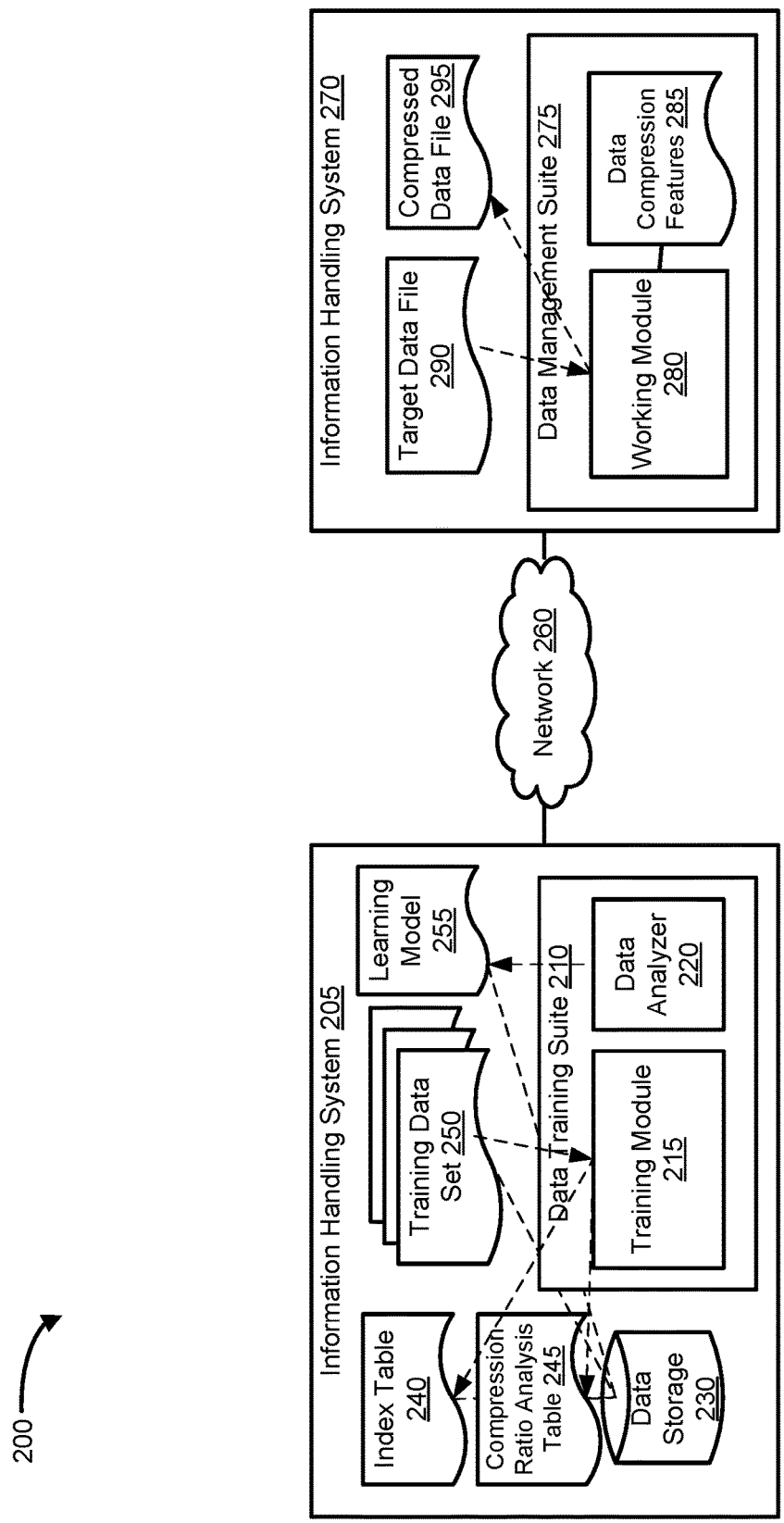
FIG. 2 is a block diagram illustrating an example of a system for content-based dynamic hybrid data compression, according to an embodiment of the present disclosure.

FIG. 2 illustrates an example of environment 200 for content-based dynamic hybrid data compression. Environment 200 includes an information handling system 205 communicatively coupled to an information handling system 270 via a network 260. Information handling systems 205 and 270 are similar to information handling system 100 of FIG. 1. Information handling system 205 includes a data training suite 210, a data storage 230, an index table 240, a compression ratio analysis table 245, a training data set 250, and learning model 255. Data training suite 210 includes a training module 215 and a data analyzer 220. Information handling system 270 includes a data management suite 275, a target data file 290, and a compressed data file 295. Data management suite 275 includes a working module 280 and data compression features 285. The components of environment 200 may be implemented in hardware, software, firmware, or any combination thereof. The components shown are not drawn to scale and environment 200 may include additional or fewer components. In additional connections between components and/or sensors may be omitted for descriptive clarity.

The present disclosure may operate in two modes: a training mode and a working mode. The training mode includes a compression ratio analysis performed by training module 215 and probability analysis performed by data analyzer 220. In one embodiment, information handling system 205 may be a development system where a plurality of training data set 250 is read by training module 215 to generate index table 240 and/or compression ratio analysis table 245. Compression ratio analysis table 245, also referred to as a mapping table, includes optimal compression ratios associated with each training data file. The association may be used as one of the factors in selecting an appropriate compression algorithm for a target data file also referred to as a working data file or a segment thereof. Training module 215 may also generate data compression features 285 which may be transmitted to information handling system 270 during installation of data management suite 275. Data compression features 285 may include parameters with information for the compression of target data file 290. For example, data compression features 285 may include index table 240 and compression ratio analysis table 245. Data compression features 285 may also include matrix A, matrix B, and matrix 7C as depicted in learned model 627 of FIG. 6.

Data analyzer 220 may be configured to perform probability analysis on training data set 250 and generate learning model 255. The probability analysis may include a Hidden Markov Model is used for statistically modeling a system where an output of the system, such as a sequence of symbols produced during data compression is visible but the specific state changes that produced the output such as the data compression algorithm are not visible. As a non-limiting example, data analyzer 220 may generate learning model 255 which includes a state transition probability matrix designated as matrix A, an observation probability matrix designated as matrix B, and an initial state distribution matrix designated as matrix π. Learning model 220 may be used for the extraction of statistical features which represent the relationships between the content of the training data file and a data compression algorithm. After extracting the statistical features, data analyzer 220 may utilize the Baum-Welch algorithm which uses the Expectation-Maximization algorithm to find the maximum likelihood estimate of the parameters of a Hidden Markov Model given a set of observed state sequences.

Working module 280 may be configured to divide target data file 290 into one or more segments and predict an optimal data compression algorithm for each segment. Working module 280 may be configured to use a multi-threading approach to process each segment in parallel. Working module 280 predicts the optimal data compression algorithm for each segment using the extracted statistical features in learning model 255. Working module 280 may then combine each of the compressed segments using a unified format generating compressed data file 295 which is similar to output 620 of FIG. 6.

In one embodiment, working module 280 may receive a request from data management suite 275 to compress target data file 290. Responsive to the request, working module 280 may retrieve or receive target data file 290 and generate compressed data file 295 using the method recited herein. Target data file 290 may be divided into one or more segments of equal length. If the length of the last segment is not equal to the other segments, a flag may be used to store the length of the last segment. An optimal data compression algorithm may be predicted for each segment based on data compression features 285. Each segment may then be compressed using the optimal data compression algorithm. Each segment may be compressed using a different data compression algorithm than the other segments.

Network 260 may be implemented as or may be a part of, a storage area network (SAN), a personal area network (PAN), a local area network (LAN), a metropolitan area network (MAN), a wide area network (WAN), a wireless local area network (WLAN), a virtual private network (VPN), an intranet, the Internet, or any other appropriate architecture or system that facilitates the communication of signals, data and/or messages. Network 260 may transmit data using any storage and/or communication protocol, including without limitation, Fibre Channel, Frame Relay, Asynchronous Transfer Mode (ATM), Internet Protocol (IP), other packet-based protocol, small computer system interface (SCSI), Internet SCSI (iSCSI), Serial Attached SCSI (SAS), or any other transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 260 and its various components may be implemented using hardware, software, or any combination thereof.

Data storage 230 may be a persistent data storage device. Data storage 230 may include solid-state disks, hard disk drives, magnetic tape libraries, optical disk drives, magneto-optical disk drives, compact disk drives, compact disk arrays, disk array controllers, and/or any computer-readable medium operable to store data. Data storage 230 may include a database or a collection of data files associated with the processing of training data set 250 that data training suite 210 may store, retrieve, and utilize, such as index table 240, compression ratio analysis table 245, learning model 255 and training data set 250.

Although data training suite 210 and data management suite 275 are shown deployed into two different information handling systems, data training suite 210 and data management suite 275 may be deployed in one information handling system or more than two information handling systems. For example, two information handling systems may each have a data training suite 210 operating in parallel. In another example, one information handling system may include training module 215 while another information handling system may include a data analyzer 220.

Those of ordinary skill in the art will appreciate that the configuration, hardware, and/or software components of environment 200 depicted in FIG. 2 may vary. For example, the illustrative components within environment 200 are not intended to be exhaustive, but rather are representative to highlight components that can be utilized to implement aspects of the present disclosure. For example, other devices and/or components may be used in addition to or in place of the devices/components depicted. The depicted example does not convey or imply any architectural or other limitations with respect to the presently described embodiments and/or the general disclosure. In the discussion of the figures, reference may also be made to components illustrated in other figures for continuity of the description.

Figure 3:
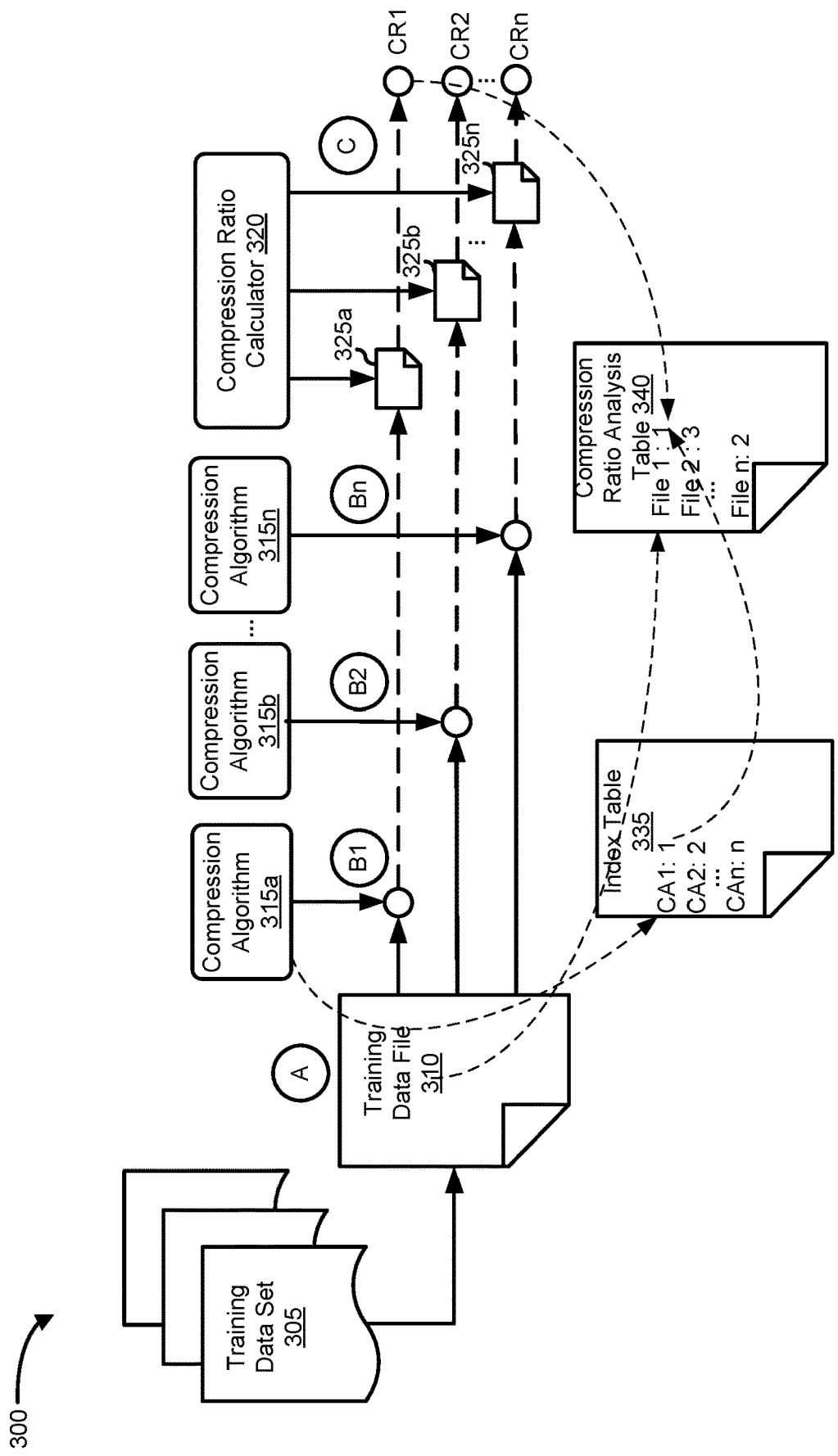
FIG. 3 is a flow diagram illustrating an example of a process during a training mode for content-based dynamic hybrid data compression, according to an embodiment of the present disclosure.

FIG. 3 shows a flow diagram of a process 300 depicting compression analysis during the training mode of a system for content-based hybrid data compression. Process 300 includes a training data set 305, a training data file 310, data compression algorithms 315a-315n, a compression ratio calculator 320, compressed data files 325a-325n, an index table 335, and a compression ratio analysis table 340. While embodiments of the present disclosure are described in terms of information handling system 205 of FIG. 2, it should be recognized that other systems may be utilized to perform the described method. One of skill in the art will appreciate that this flow diagram explains a typical example, which can be extended to advanced applications or services in practice.

FIG. 3 is annotated with a series of letters A-B1/B2-Bn-C. Each of these letters represents a stage of one or more operations. Although these stages are ordered for this example, the stages illustrate one example to aid in understanding this disclosure and should not be used to limit the claims. Subject matter falling within the scope of the claims can vary with respect to the order of the operations.

One of the goals of the training mode is to generate a compression ratio analysis table 340 that captures the optimal compression ratio of each file, such as a training data file 310 of training data set 305. Training data set 305 may be selected to be representative of expected data sets that will be compressed during a working mode. Training data set 305 may be collected from different files from different types or models of computer systems as may be encountered during the working mode. These different files are also referred to as training data files.

A desirable data compression algorithm also interchangeably referred to herein as an optimal data compression algorithm for the training mode or desirable data compression technique may be associated with each training data file of the training data set 305. To determine the desirable data compression algorithm, an individual training data file, such as training data file 310, may be selected from training data set 305 at stage A. At stages B1-Bn each of a plurality of data compression algorithms or techniques, such as data compression algorithms 315a-315n may be used to compress the individual training data file resulting in compressed data files 325a-325n. Compressed data file 325a resulted from compressing training data file 310 using data compression algorithm 315a. Compressed data file 325b resulted from compressing training data file 310 using data compression algorithm 315b. Compressed data file 325n resulted from compressing training data file 310 using compression algorithm 315n.

In one example, data compression algorithm 315a may be the Run Length Encoding (RLE) data compression algorithm, which is a form of lossless encoding where sequences of repeated symbols in the uncompressed data set are replaced by an individual control symbol and the individual uncompressed symbol in the compressed data set. Data compression algorithm 315b may be the Differential Pulse Code Modulation (DPCM) data compression algorithm which is a form of lossless encoding where each subsequent symbol in the uncompressed data set is compared to a reference symbol and a distance between their code points is encoded into the uncompressed data set if it is below a distance threshold. DPCM takes advantage of the fact that the symbols in the uncompressed data set may cluster within localized portions of data space and therefore the distance between reference symbols and the individual uncompressed symbol may be represented using fewer bits than it would take to represent the individual uncompressed symbol.

Compression algorithm 315n may be the GZIP data compression algorithm which refers to one of a number of implementations of file compression and decompression based on Lempel, Ziv, Welch (LZW), and Huffman code. Like LZW, GZIP identifies previously occurring sequences of arbitrary length and encoding one or more uncompressed symbols as individual control symbols that reference previously observed sequences. LZW is a lossless data compression algorithm that builds a dictionary that tracks sequences of symbols. As symbols are read from the uncompressed data file any identical sequence of symbols that is already in the dictionary is found up to the point where the dictionary pattern and the input pattern diverge. At that point, a code presenting the matching portion of the pattern is passed to the compressed data file and the divergent symbol is added to the dictionary as an extension of the pattern that preceded it. LZW may be implemented using variable length codes to allow the dictionary to grow until the individual control symbol to reset the dictionary and start over is placed into the compressed data set. Under LZW, the decoder builds the same dictionary that an encoder built as the compressed data set is produced and is, therefore, able to interpret the symbols in the compressed data set that represent sequences.

At stage C, an optimal compression ratio is determined from two or more compression ratios, such as CR1-CRn. Compression ratio is the ratio between the uncompressed size and uncompressed size of the data set or data file such as:

$$\text{Compression Ratio} = \frac{\text{Uncompressed Size}}{\text{Compressed Size}}$$

The optimal compression ratio is the compression ratio that achieves a maximum compression ratio of a data compression algorithm compared to the other data compression algorithms. The association between a training data file and the optimal compression ratio may be stored in compression ratio analysis table 340. In this example, the optimal compression ratio associated with training data file 310 is CR1 which is mapped to data compression algorithm 315a as shown in index table 335. Thus, data compression algorithm 315a is the desirable data compression algorithm for training data file 310.

FIG. 4 shows an example matrix 400 that is used to count the occurrences of symbol transitions in the training data sets in association with data compression algorithms. The dimensions of matrix 400 may be used in the following manner: the symbols appearing vertically up and down the left side of matrix 400 corresponds to the starting symbol of a symbol transition in the training data file while the symbols appearing across the top of the matrix correspond to the ending symbol of a symbol transition in the training data file. The cell which corresponds to the starting symbol and the ending symbol shows where the symbol transition is seen. The cell is incremented for each transition and associated with the desirable data compression algorithm associated with the training data file being processed. One of skill in the art will appreciate that matrix 400 which is depicted as a 14×14 matrix is a simplified example for ease of understanding and that in real-world conditions, matrix 400 would be larger than depicted.

Matrix 400 is a symbol transition tracking matrix and it tabulates the number of specific symbol transitions occurring for training data sets that are compressed by a specific data compression algorithm. A first training data file 405a, a second training data file 405b, and a third training data file 405n are shown at the bottom of matrix 400. The sizes of each training data file and the number of data sets have been kept small to simply the non-limiting example. In this example, the RLE data compression algorithm was determined to be the desirable data compression algorithm for first training data file 405a. The DPCM data compression algorithm was determined to be the desirable data compression algorithm for second training data file 405b. The GZIP data compression algorithm was determined to be the desirable data compression algorithm for third training data file 405n. There may be more or less than the training data files shown. In addition, the training data files may have different data compression algorithms that have been found to be the data compression algorithm for a particular training data file and/or training data set.

Matrix 400 may be initialized to zero in every cell. Every symbol transition in each of the training data sets or training data files may be examined and tabulated in matrix 400. Matrix 400 may be updated when processing each training data file. In this example, the first two symbols in first training data file 405a are "AA" so a cell 410 is incremented. The alphabet of symbols appears on the left side and across the top of matrix 400 so that these symbol transitions can be indexed. The next symbol transition in first training data file 405b is "AB" so cell 415 is incremented. The symbol transition "BB" appears four times in a row so cell 417 is incremented four times. The remainder of first training data file 405a is examined and tabulated in the same way. The increments associated with first training data file 405a are underlined such as "1."

The first two symbols in second training data file 405b are "AB" so cell 415 is incremented. Note that cell 415 was incremented above when first training data file 405a was analyzed. The increments associated with second training data file 405b are italicized such as "/." The first two symbols in third training data file 405n are "CG" so cell 425 is incremented. The increments associated with third training data file 405n are in bold such as "1." Note that cell 430 is incremented twice as the symbol transition "DE" appears both on the second training data file 405b and third training data file 405n.

FIG. 5A shows a table 505 also referred to as matrix B is an observation probability table and it tabulates the probability of a data compression algorithm being used after a specific symbol appears in the data according to the training data set. The value in cell 520 of row 525 indicates there is a sixty-six percent probability that the RLE data compression algorithm would be used after the symbol "A" appears in the training data file according to the training data set. Calculation of the aforementioned value and the values in row 525 includes the following: there are two symbol transitions that start with the symbol "A" from first training data file 405a as shown in matrix 400 of FIG. 4. There is one symbol transition that starts with the symbol "A" from second training data file 405b as shown in matrix 400 of FIG. 4. There is no symbol transition that starts with the symbol "A" from third training data file 405c as shown in matrix 400 of FIG. 4. Thus, there are a total of three symbol transitions that start with the symbol "A." Of the three total symbol transitions that start with the symbol "A" two out of three or sixty-seven percent are from first training data file 405a associated with RLE data compression algorithm, one out of three or thirty-three percent are from second training data file 405b associated with DPCM data compression algorithm, zero out of three or zero percent are from third training data file 405c associated with GZIP data compression algorithm. These values populate row 525. Other rows of table 505 may be calculated in the same manner.

FIG. 5B shows a table 510 also referred to as matrix 7C is an initial state distribution matrix and it tabulates the probability of a specific data compression algorithm being used initially. Values in the matrix 7C are computed at the end of a training mode by calculating what percentage of the training data sets were most effectively compressed by each data compression algorithm. In this simple non-limiting example, only three training data files were used and each one was compressed most effectively under a different data compression algorithm. The value in cell 530 of row 535 indicates that there is one training data file that is associated with the RLE data compression algorithm out of three total training data files or thirty-three percent. The same calculation may be performed for the DPCM data compression algorithm and the GZIP data compression algorithm.

FIG. 5C shows a table 515 also referred to as matrix A is a state transition probability matrix and it tabulates the probability of a transition from one data compression algorithm to another data compression algorithm according to the training data set. After matrix 400 of FIG. 4 has been tabulated using the training data files in the training data set, the values in matrix A may be calculated which indicates the probability that the compression algorithm will change state.

The value in cell 540 of row 545 indicates that there is a ninety percent probability that if the RLE compression algorithm is used for a symbol transition, then the RLE compression algorithm may be used for the next symbol transition. Calculation of the aforementioned value and other values in row 545 includes the following: there are nine symbol transitions of the first training data file 405a which is associated with the RLE data compression algorithm as indicated in matrix 400 of FIG. 4. In addition, there is one symbol transition that overlaps the symbol transitions of the first training data file 405a. Specifically, the symbol transition "AB" is incremented twice in cell 415. The second increment is from second training data file 405*b* associated with the DPCM data compression algorithm. Thus, there are a total of ten symbol transitions. Because there are nine symbol transitions from the first training data file 405*a* associated with the RLE data compression algorithm, of the total of ten symbol transitions, there is an RLE-to-RLE data compression algorithm transition probability of ninety percent. Because there is one overlap symbol transition from second training data file 405*b* associated with the DPCM data compression algorithm, of the total ten symbol transitions, there is one RLE to DPCM data compression algorithm transition probability of ten percent. Because there is no overlap symbol transition from the third training data file 405*c* associated with GZIP data compression algorithm, there is an RLE to GZIP data compression algorithm transition probability of zero percent. Other rows of matrix A may be calculated in the same manner.

Figure 6:
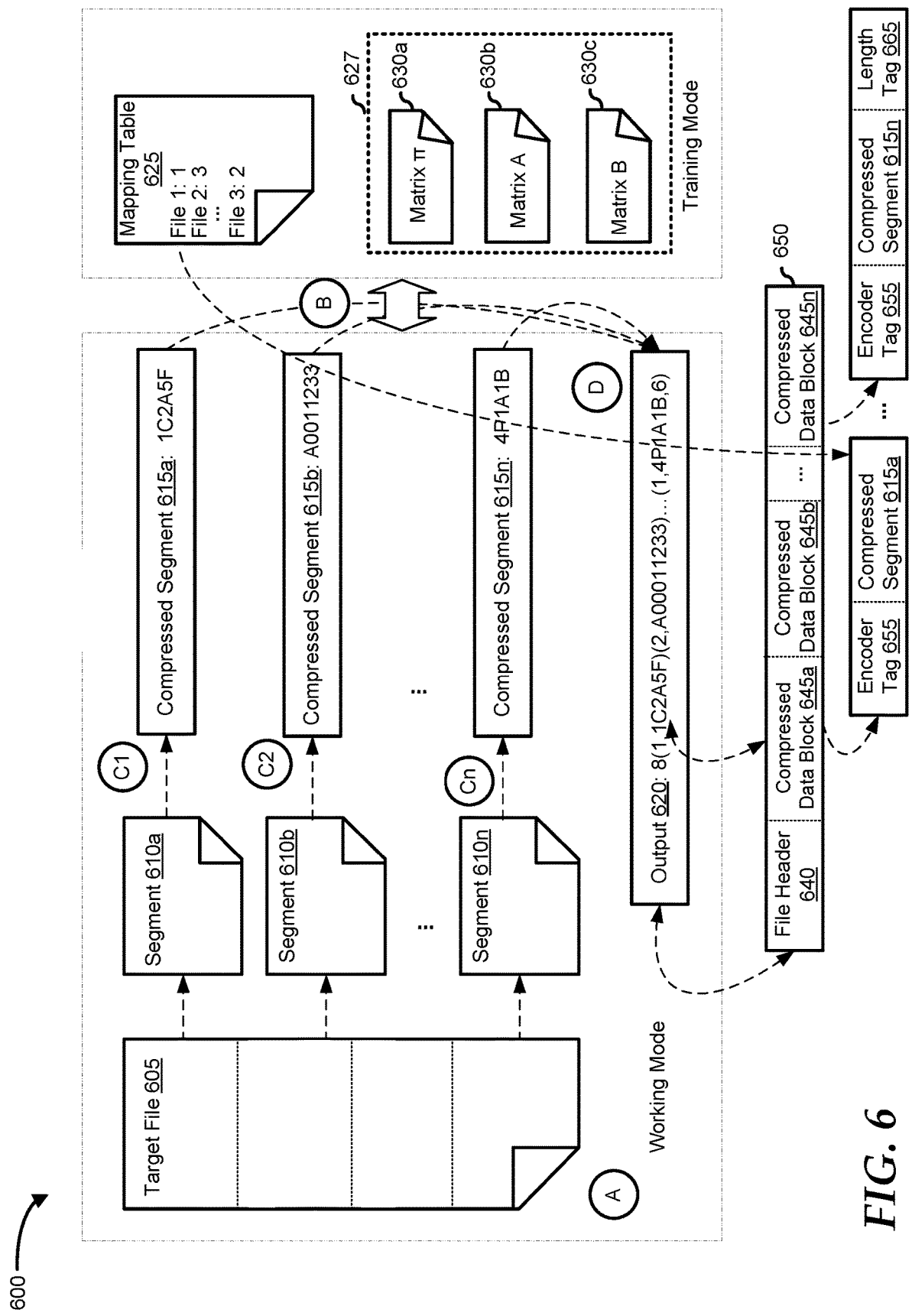
FIG. 6 is a flow diagram illustrating an example of a process during a working mode for content-based dynamic hybrid data compression, according to an embodiment of the present disclosure.

FIG. 6 shows a flow diagram of an example of a process 600 depicting stages of data compression during a working mode for a content-based hybrid data compression. The data compression may be performed on a working data set, working data file, or segments thereof. Process 600 includes a target file 605, segments 610*a*-610*n*, a compressed segment 615*a*-615*n*, an output 620, a compression ratio analysis table 625, a data structure 650, and a learned model 627 which includes matrices 630*a*-630*c*. While embodiments of the present disclosure are described in terms of environment 200 of FIG. 2, it should be recognized that other systems may be utilized to perform the described method. One of skill in the art will appreciate that this flow diagram explains a typical example, which can be extended to advanced applications or services in practice.

FIG. 6 is annotated with a series of letters A-C1/C2-Cn-D. Each of these letters represents a stage of one or more operations. Although these stages are ordered for this example, the stages illustrate one example to aid in understanding this disclosure and should not be used to limit the claims. Subject matter falling within the scope of the claims can vary with respect to the order of the operations.

At stage A, target file 605 is divided into one or more segments. A target data file may also be referred to as a working data file. The segments may be of equal length except for the last segment which may be shorter or longer than the other segments. Here, target file 605 is divided into segments 610*a*-610*n* of a specific length. At stage B, an optimal data compression algorithm associated with each segment may be predicted based on the analysis during the training mode. At stages C1-Cn, each segment 610*a*-610*n* may be compressed using the optimal data compression algorithm for each segment predicted at stage B. For example, segment 615*a* may be compressed using the RLE data compression algorithm while segment 610*b* may be compressed using the DPCM data compression algorithm and segment 610*n* may be compressed using GZIP data compression algorithm.

At stage D, compressed segments 615*a*-615*n* are combined resulting in output 620 using a unified format based on data structure 650. Output 620 includes a separator between its elements such as between the compressed content and between the compression index and the compressed content. In the example shown, a comma and parenthesis are used as separators: 8(1.1C2A5F)(2,A00011233) . . . (1,4P1A1B,6), although other characters or marks may be used as a separator. Data structure 650 includes a file header 640 and compressed data blocks 645*a*-645*n*. File header 640 may include metadata associated with the target file, segments, and/or compressed segments. For example, file header 640 may include the size and length of each segment, file name, date and time stamps, size of the output or file size, checksums, etc. In some embodiments, file header 640 may include the number and/or size of the compressed data blocks that follow, such as compressed data blocks 645*a*-645*n*. The end of the file header may be marked by a separator. Each compressed data block may include an encoder tag 655 and a compressed data payload which is a compressed segment, such as compressed segment 615*a*. Encoder tag 655 indicates which of the data compression algorithms was used to compress the compressed data segment. The last compressed data block, such as compressed data block 615*n*, may also include a length tag 665 if the length of the last segment is different from the other segments. If the last compressed data block does not include length tag 665, then the last segment is the same size as the other segments.

FIG. 7A-7E show sequences 700, 730, 740, 750, and 760 which are sequences of decisions made during a working mode are depicted. The sequence of decisions may be based on a set of statistical features that were extracted and/or calculated based on the training mode and includes a string of symbols observed in a data block of a target data file, a history of previous state transitions, or combinations thereof. The sequence of decisions may be used to determine the optimal data compression algorithm based on a symbol-to-symbol analysis. The characters or symbols in a segment 705 of a target data file are used as a non-limiting example for illustration shown herein.

Sequence 700 of FIG. 7A shows a first observed symbol at node 715, a "C" is read from the data block, and in conjunction with the set of statistical features at decision A, a prediction is made that DPCM is the data compression algorithm used. The prediction is based on matrix 7C cell 532, where DPCM data compression has the highest probability with a value of thirty-five percent to be used as the initial data compression algorithm.

At decision B, a prediction on which symbol follows the symbol C is made. Based on row 423 of matrix 400 of FIG. 4, wherein the starting symbol is C, either symbol D or symbol G may be the next symbol after C. Since two probable symbols follow the symbol C, a determination may be made as to which of the symbols D or G follows the symbol C may be made. First, a determination of the data compression algorithm at decision point C may be made. Based on row 547 of table 515 (matrix A), a maximum data value between the three data compression algorithms is selected, such as max (DPCM=0.82, GZIP=0.09, and RLE=0.09). Here, the DPCM data compression algorithm is selected based on its eighty two percent probability that a state starting at the DPCM data compression algorithm will have an ending state of DPCM data compression algorithm, at decision C. Second, a determination on whether the symbol D or symbol G follows the symbol C based on the aforementioned decision. At decision point D, row 528 and row 529 of table 505 (matrix B) are referenced based on their association with symbols D and G respectively. For symbol D, its probability to follow the symbol C based on cell 523 is fifty percent. For symbol G, its probability to follow the symbol C based on cell 524 is twenty-five percent. A maximum between the two probabilities is selected such as max {D (DPCM)=0.5, G (DPCM)=0.25)}. Accordingly, symbol D is predicted to be the next symbol as depicted in node 720.

At FIG. 7B, the system continues to retrieve the next symbol in segment 705 following the symbol, which is the symbol B. Since the predicted symbol is different, node 720 is overwritten with the retrieved symbol B. At decision point E, based on matrix 400 row 422, a probability that the next symbol after B is determined to be one of symbols B, C, or H. Since there are three probable symbols to follow the symbol B, a determination may be made as to which of the three symbols follow B may be made. Based on cell 417, the symbol B is incremented four times compared to the symbols C or D being incremented once each, the symbol B is predicted to follow the earlier symbol B. At decision point F, based on row 547 of table 515 (matrix A), a maximum data value between the three data compression algorithms is selected, such as max (DPCM=0.82, GZIP=0.09, and RLE=0.09) may be determined. Here, the DPCM data compression algorithm is predicted to be an ending state if the starting state is a DPCM data compression algorithm based on its eighty-two percent probability. However, based on table 505 (matrix B) row 526, max (RLE=0.83, DPCM=0.17, GZIP=0), if the starting symbol is B, then the RLE data compression algorithm is predicted to be used at node 725 with an eighty-three percent probability which is greater than the eight-two percent probability of the DPCM data compression algorithm.

Figure 7D:
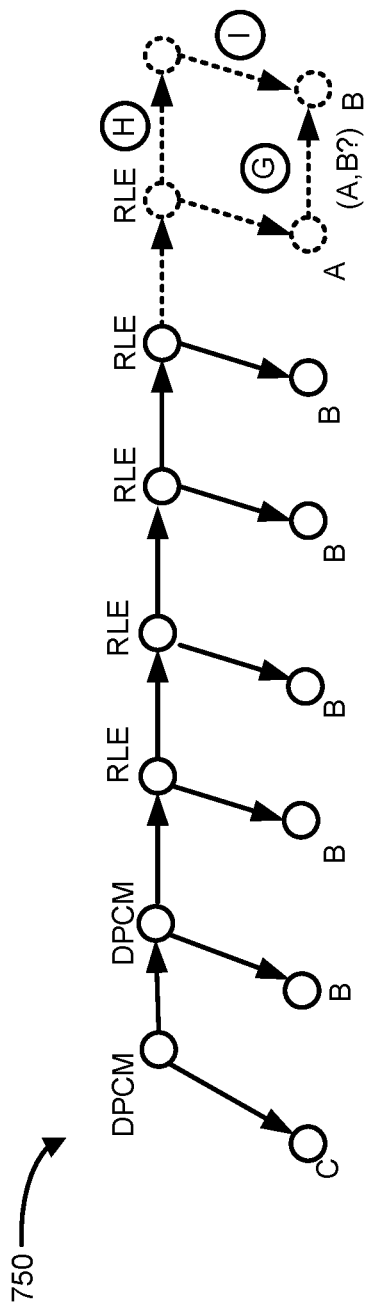

FIG. 7C shows a sequence 740 after several iterations of state sequences as shown in sequence 730 of FIG. 7B with similar decisions. As the symbols are all B's the RLE data compression algorithm is predicted in the next state sequences as well. FIG. 7D shows a sequence 750 depicting the state sequences in predicting the desired data compression algorithm for the next symbol A in segment 705. The system retrieves the symbol A and proceeds to determine the next symbol at stage G which could be the symbol A or B based on row 421 of matrix 400. Based on row 545 of table 515 (matrix A) the prediction is made that the RLE data compression algorithm is the desirable data compressed algorithm at decision point H. The prediction is based on the maximum between three data compression algorithms, such as max (RLE=0.9, DPCM=0.1, GZIP=0). Referring to row 525 of table 505 (matrix B), a prediction of sixty-seven percent probability is associated with starting symbol A under the RLE data compression algorithm. In comparison, in row 526 a prediction of eighty-three percent probability is associated for starting symbol B under the RLE data compression algorithm. The symbol after symbol A is max (A=0.67, B=0.83). Thus, symbol B is predicted to be the next symbol at decision point I.

Figure 7E:
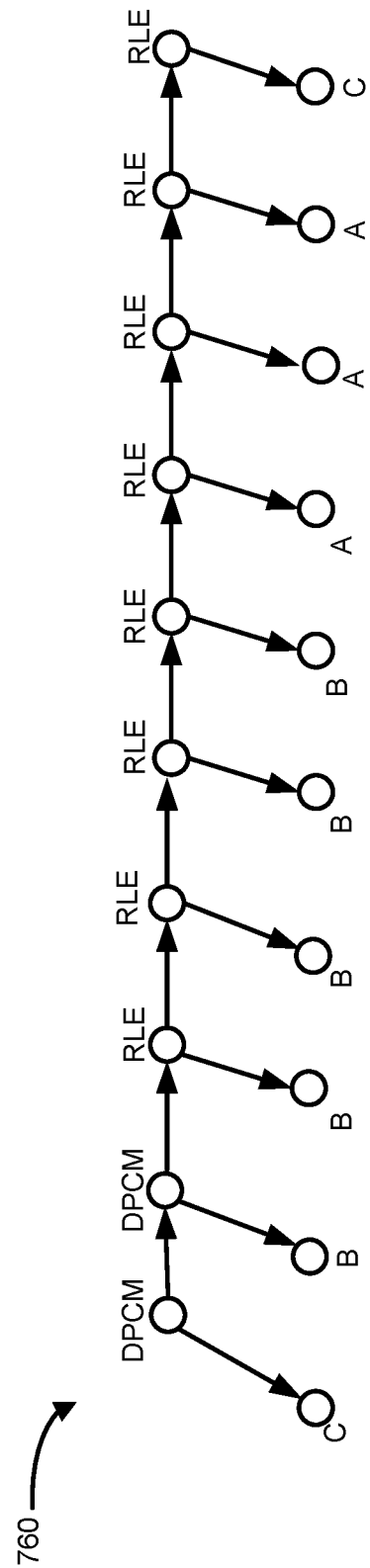

FIG. 7E shows sequence 760 which includes the state sequences for segment 705. Here, the DPCM data compression algorithm is predicted twice and the RLE data compression algorithm is predicted eight times out of a total of ten. Accordingly, the optimal data compression algorithm is predicted to be the max (RLE=0.8, DPCM=0.2) which is the RLE data compression algorithm with a probability of eighty percent. To verify the prediction, segment 705 may be compressed using the RLE data compression algorithm and the DPCM data compression algorithm and determine the optimal compression ratio. The compressed text 1C5B3A1C is generated using the RLE data compression algorithm with a compression ratio of 10/8 or 1.25. The compressed text C2111110002 is generated using the DPCM data compression algorithm with a compression ratio of 10/11 or 0.909. The optimal data compression algorithm is max (RLE=1.25, DPCM=0.909) which is the RLE data compression algorithm confirming the prediction.

Figure 8A:
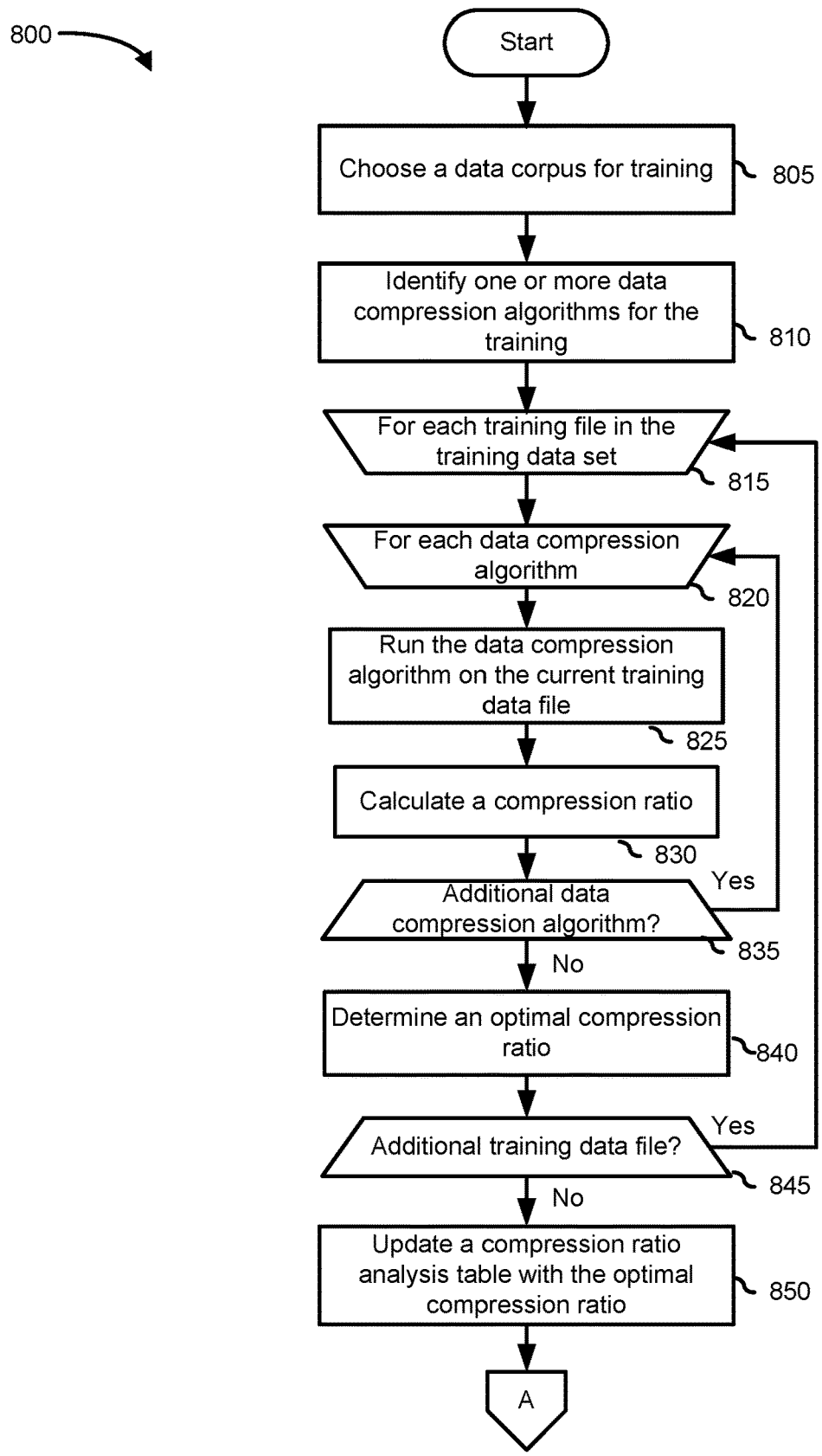
FIGS. 8A and 8B are flowcharts illustrating an example of a method at a training mode for content-based dynamic hybrid compression, according to an embodiment of the present disclosure.
Figure 8B:
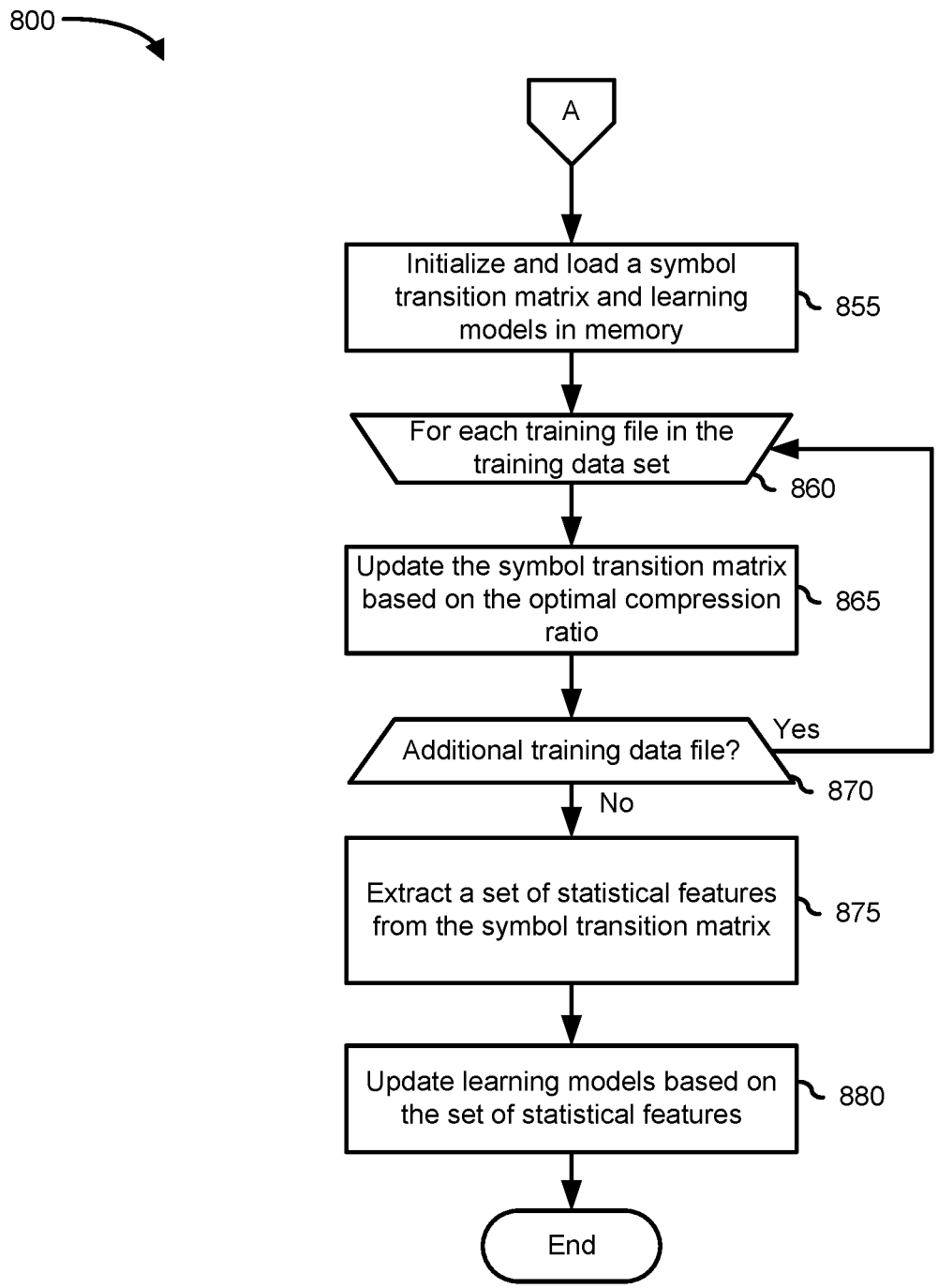

FIG. 8A and FIG. 8B show a flowchart of a method 800 for content-based hybrid data compression. Method 800 may be performed by one or more components of environment 200 and/or process 300 of FIG. 3. However, while embodiments of the present disclosure are described in terms of environment 200 and/or process 300, it should be recognized that other systems may be utilized to perform the described method. One of skill in the art will appreciate that this flowchart explains a typical example, which can be extended to advanced applications or services in practice. Method 800 may be performed at a development system, such as on the server-side of the client/server system.

Method 800 typically starts at block 805 where a plurality of training data set also referred to as a data corpus is selected to be used during the training mode of the content-based hybrid data compression. The training data set may be selected from a plurality of training data sets and may be based on the working data file to be processed. For example, if a client is identified to have audio and/or video files versus text data files, then the training data set may be chosen accordingly, such as audio and/or video training data files may be selected for a client that processes audio and/or video files.

At block 810, the method identifies one or more data compression algorithms to be used during the training mode. The data compression algorithms may be based on the type of training data files to be processed. At block 815, the method processes each training data file in the training data set. The training data file being processed may be referred to as a current training data file. At block 820, the method processes each training data file using each of the data compression algorithms. At block 825 the method runs the data compression algorithm on the current training data file being processed and calculates the compression ratio at block 830. At block 835, the method determines whether there is additional data compression to be run on the current training data file. If there is an additional data compression algorithm, then the "YES" branch is taken and the method proceeds to block 820 and uses the next data compression algorithm to process the current training data file. If there is no additional data compression algorithm, then the "NO" branch is taken and the method proceeds to block 840 where the method determines an optimal compression ratio based on the calculated one or more compression ratios at block 830.

At block 845, the method determines if there is an additional training data file to process. If there is an additional training data file to process, then the method proceeds to block 815 where the method retrieves the next training data file in the training data set for processing. If there is no additional training data file to process, then the method proceeds to block 850 where the method updates a compression ratio analysis table with the optimal compression ratio for each training data file.

At block 855, the method initializes and loads a symbol transition matrix and learning models which includes the matrix A, matrix B, and matrix 7C in memory. The symbol transition matrix may be similar to matrix 400 of FIG. 400. At block 865, the method initializes and loads learning parameters also referred herein as the learning models in memory. The learning models include models which may be associated with the Hidden Markov Model such as a first matrix A, a second matrix B, and a third matrix π. The matrices may be defined using an array that may be used during calculation and loaded into memory then initialized with a value of zeros in each cell.

At block 860, the method processes each training data file in the training data set. At block 865, the method updates the symbol transition matrix for each of the training data files. For example, the method may update the symbol transition matrix such as matrix 400 for each of training data files

405a-405n as shown in FIG. 4. The sequence of the symbols in each of the training data files in association with the data compression algorithm mapped to the optimal compression ratio may be used to denote an observation sequence in the symbol transition matrix. The optimal data compression algorithm may be determined based on the information in a compression ratio analysis table and an index table such as compression ratio analysis table 245, index table 240 of FIG. 2, index table 335, and compression ratio analysis table 340 of FIG. 3. A pair of the symbols are read sequentially from each of the training data files and used to increment a cell that reflects the intersection of the pair in the symbol transition matrix as depicted in FIG. 4.

At block 870, the method may determine whether there is an additional training data file to be processed. If there is an additional training data file, then the "YES" branch is taken and the method proceeds to block 860 and processes the current training data file. If there is no additional training data file to be processed, then the "NO" branch is taken and the method proceeds to block 875.

At block 875, the method may extract a set of statistical features from the symbol transition matrix. The method may perform one or more calculations to determine the set of statistical features. For example, for the matrix 7C, the method may apply the Baum-Welch algorithm, the Baum-Welch forward procedure for matrix A, and the Baum-Welch backward procedure in matrix B. The Baum-Welch algorithm uses the expectation-maximization algorithm to find the maximum likelihood estimate of the parameters of a Hidden Markov Model given a set of observed feature vectors, such as that in the symbol transition matrix.

At bock 880, the method may update the learning models, such as matrix A, matrix B, and matrix 7C based on the set of extracted statistical features in block 875. After the update, the information in the learning models may be packaged and be a part of an installation package for distribution at a customer's site.

Figure 9:
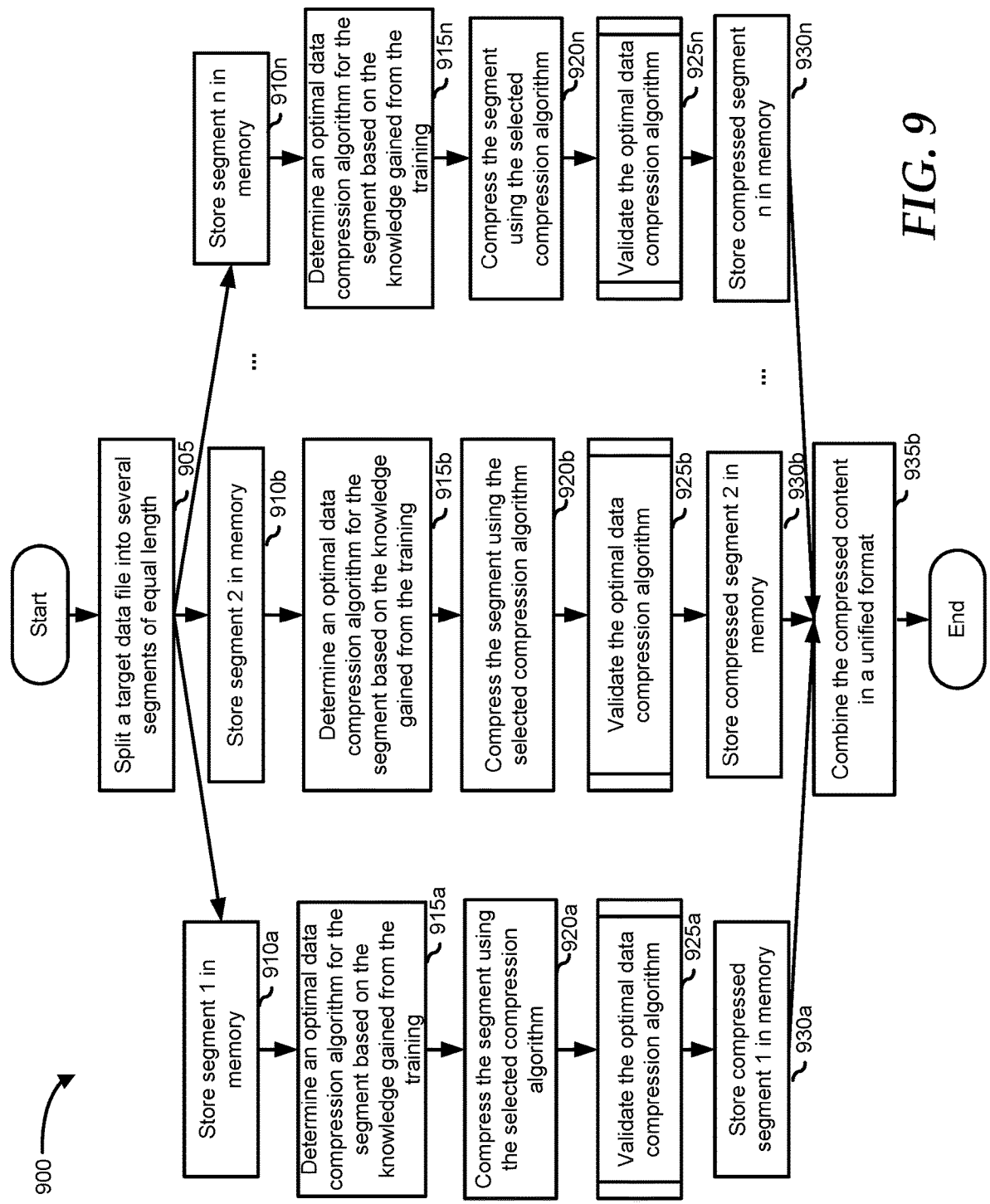
FIG. 9 is a flowchart illustrating an example of a method at a working mode for content-based dynamic hybrid compression, according to an embodiment of the present disclosure.

FIG. 9 shows a flowchart of a method 900 for content-based hybrid compression. Method 900 may be performed by one or more components of environment 200 of FIG. 2 or process 600 of FIG. 6. However, while embodiments of the present disclosure are described in terms of environment 200 and/or process 600, it should be recognized that other systems may be utilized to perform the described method. One of skill in the art will appreciate that this flowchart explains a typical example, which can be extended to advanced applications or services in practice. Method 900 may be performed by a client in a client/server system. An installation package that includes the information from the learning models may be installed first before method 900 may be used to compress a data file.

Method 900 typically starts at block 905 where a target data file is divided into several segments of equal length. The target data file may be divided based on the number of characters or symbols in the target data file. If there are an uneven number of characters or symbols, the last segment may have more or fewer characters or symbols than the other segments. For non-Latin-based text target data files, the text may be encoded in Unicode before dividing the target data file into segments. The same process may be performed for non-text target data files, such as audio or video files. For example, audio or video files may be encoded using various encoding schemes such as base64 encoding before processing such audio or video files. Each segment is processed in parallel. Thus, the number of threads to be used in processing each segment concurrently will be based on the number of segments. For example, method 900 may use n number of threads for processing n number of segments. Although the example shown below depicts blocks 910a though 930a similar process may be used in processing up to n number of segments.

At block 910a, the method stores a segment of the target data file in memory. The segment being processed may be referred to as a current segment. The method proceeds to block 915a where the method determines an optimal data compression algorithm for the current segment. The optimal data compression algorithm may be determined based on the knowledge gained during the training mode, such as depicted in process 600 of FIG. 6. In particular, given a sequence of symbols or text such as a segment or a data file, the optimal data compression algorithm may be determined based on the statistical features associated with the learned models such as matrix A, matrix B, and matrix π. An optimal state sequence may be generated for the segment, as depicted in FIG. 7A—FIG. 7E. The state, that is the data compression algorithm, which has the most occurrences in the state sequences, is the optimal data compression algorithm. At block 920a, the method compresses the segment using the optimal data compression algorithm in block 915a. The method may determine a first compression ratio of the compressed segment. At block 925a, the method may validate the optimal data compression algorithm determined at block 915a.

At block 930a, the method determines stores a compressed segment in memory. At block 935 the compressed segments are combined resulting in an output of a unified format similar to data structure 650 of FIG. 6. The output may include the size or length of each segment and the compressed data block. The size or length may be the number of characters in each segment. Each compressed data block includes a prefix and the compressed segment. The prefix may be an index of the optimal data compression algorithm used to compress the segment. Because the last compressed segment may not be the same size as the other compressed segment the compressed data block associated with the last compressed segment may also include a suffix, wherein the suffix is the size or length of the last compressed segment. If the last compressed segment is the same size or length as the other segments, then the suffix may not be included. After validation, the method ends.

Figure 10:
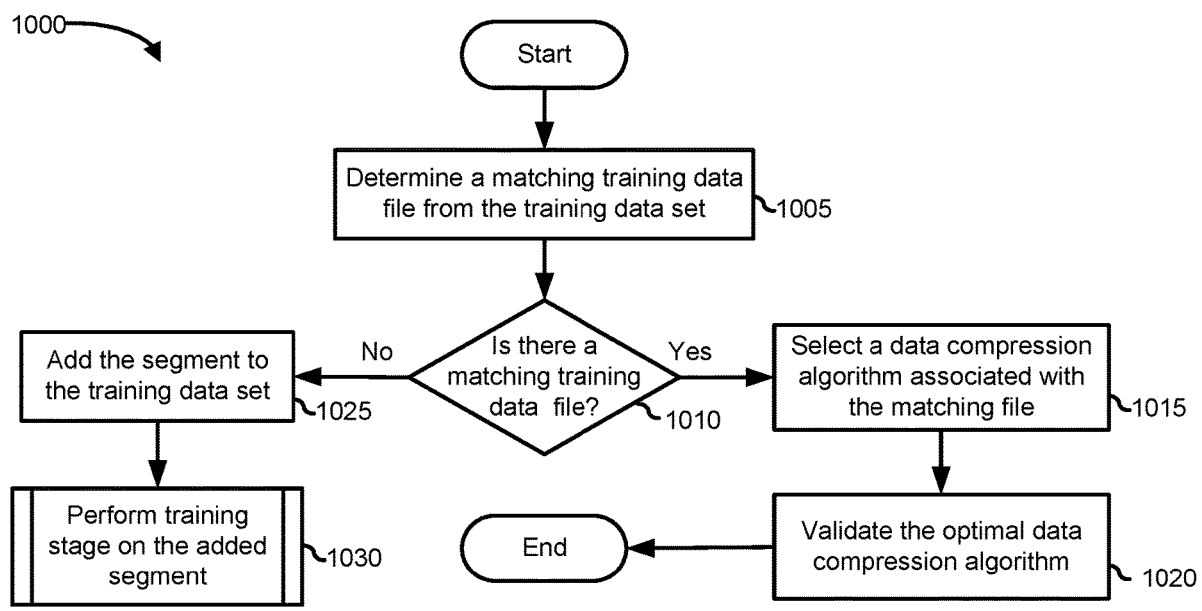
FIG. 10 is a flowchart illustrating an example of a method for validating an optimal data compression algorithm for content-based dynamic hybrid compression, according to an embodiment of the present disclosure.

FIG. 10 shows a flowchart of a method 1000 for content-based hybrid data compression. In particular, method 1000 is a detailed illustration of block 925 of FIG. 9. Method 1000 typically starts at block 1005, where the method determines whether the current segment has a matching data file from the training data set. For example, a comparison of the symbols and/or symbol transition in the data file and the segment may be compared based on one or more factors such as its type, such as whether the data file is audio, video, text file, etc. At decision block 1010, if there is a matching training data file then the "YES" branch is taken and the method proceeds to block 1015. If there is no matching data file then the "NO" branch is taken and the method proceeds to block 1025.

At block 1015, a data compression algorithm associated with the matching training data file is selected based on the knowledge gained during the training mode. The data compression algorithm may be selected using a mapping table similar to compression ratio analysis table 340 of FIG. 2. At block 1020, the method may validate the optimal data compression algorithm. The method may compress the segment using the data compression algorithm based on the compression ratio analysis table and determine a second compression ratio. The method may perform a comparison of the first compression ratio and the second compression ratio. If the first compression ratio is greater than or equal to the second compression ratio, then the optimal compression ratio is validated. At block 1025, the current segment is added to the training data set. The method proceeds to block 1030 where the method proceeds to the training mode, wherein the target data file is trained. For example, block 910a though blocks 930a may be performed in parallel with blocks 910b through 930b up to blocks 910n through 930n of method 900 of FIG. 9.

Although FIG. 8A, FIG. 8B, FIG. 9, and FIG. 10 show example blocks of method 800, method 900, and method 1000 in some implementation, method 800, method 900, and method 1000 may include additional blocks, fewer blocks, different blocks, or differently arranged blocks than those depicted in FIG. 8A, FIG. 8B, FIG. 9, and FIG. 10. Additionally, or alternatively, two or more of the blocks of method 800, method 900, and method 1000 may be performed in parallel. For example, block 805 and block 810 may be performed in parallel.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method comprising:
   processing a training data file to predict an optimal data compression algorithm, wherein the processing of the training data file includes:
      performing a compression ratio analysis that includes:
         compressing the training data file using a plurality of data compression algorithms;
         calculating a compression ratio associated with each data compression algorithm of the data compression algorithms;
         determining an optimal compression ratio from the compression ratios associated with the each of the data compression algorithms; and
         identifying a desirable data compression algorithm associated with the optimal compression ratio for the training data file; and
      performing a probability analysis that includes:
         generating a symbol transition matrix based on the desirable data compression algorithm;
         extracting statistical feature data based on the symbol transition matrix; and
         generating probability matrices based on the statistical feature data for predicting the optimal data compression algorithm for each segment of a working data file.

2. The method of claim 1, generating a compression ratio analysis table that includes an association of the training data file with the desirable data compression algorithm.

3. The method of claim 1, wherein the optimal compression ratio has a maximum value in comparison with at least one other compression ratio associated with the training data file.

4. The method of claim 1, further comprising processing the working data file, wherein the processing of the working data file includes dividing the working data file into a one or more segments and compressing each segment based on the optimal data compression algorithm generating one or more compressed segments.

5. The method of claim 4, wherein each segment of the working data file is of equal length.

6. The method of claim 4, further comprising combining each compressed segment using a unified format into a compressed data file.

7. The method of claim 6, wherein a first data compression algorithm is used to compress a first segment and a second data compression algorithm is used to compress a second segment of the compressed data file.

8. The method of claim 1, wherein the probability matrices include an initial state distribution matrix, a state transition probability matrix, and an observation probability matrix.

9. An information handling system, comprising:
   a memory to store probability matrices used in determining an optimal data compression algorithm; and
   a processor coupled to the memory, the processor configured to process a training data file to determine the optimal data compression algorithm, wherein the processor is further configured to:

perform a compression ratio analysis that includes:
        compressing the training data file using a plurality of data compression algorithms;
        calculating a compression ratio associated with each of the data compression algorithms;
        determining an optimal compression ratio from the compression ratio associated with the each of the data compression algorithm; and
        determining a desirable data compression algorithm associated with the training data file based on the optimal compression ratio; and
    perform a probability analysis that includes:
        generating a symbol transition matrix based on the desirable data compression algorithm;
        extracting statistical feature data based on the symbol transition matrix; and
        generating probability matrices based on the statistical feature data to determine the optimal data compression algorithm for each segment of a working data file.

10. The information handling system of claim 9, wherein the processor is further configured to generate a compression ratio analysis table that includes an association of the training data file with the desirable data compression algorithm.

11. The information handling system of claim 9, wherein the optimal compression ratio has a maximum value in comparison with at least one other compression ratio associated with the training data file.

12. The information handling system of claim 9, wherein the processor is further configured to process the working data file that includes to divide the working data file into a one or more segments and to compress each segment based on the optimal data compression algorithm generating one or more compressed segments.

13. The information handling system of claim 12, wherein the processor is further configured to combine each compressed segment using a unified format into a compressed data file.

14. The information handling system of claim 12, wherein each segment of the working data file is of equal length.

15. A non-transitory computer-readable medium including code that when executed performs a method, the method comprising:
    processing a training data file to determine an optimal data compression algorithm, wherein the processing of the training data file includes:
        performing compression ratio analysis that includes:
            compressing the training data file using a plurality of data compression algorithms;
            calculating a compression ratio associated with each data compression algorithm of the data compression algorithms;
            determining an optimal compression ratio from the compression ratio associated with the each data compression algorithm; and
            determining a desirable data compression algorithm associated with the training data file based on the compression ratio; and
        performing a probability analysis that includes:
            generating a symbol transition matrix based on the desirable data compression algorithm;
            extracting statistical feature data based on the symbol transition matrix; and
            generating probability matrices based on the statistical feature data for determining the optimal data compression algorithm for each segment of a working data file.

16. The method of claim 15, further comprising processing the working data file, wherein the processing of the working data file includes dividing the working data file into one or more segments and compressing each segment based on the optimal data compression algorithm generating one or more compressed segments.

17. The method of claim 16, wherein each segment of the working data file is of equal length.

18. The method of claim 16, further comprising combining each compressed segment using a unified format into a compressed data file.

19. The method of claim 18, wherein a first data compression algorithm is used to compress a first segment and a second data compression algorithm is used to compress a second compressed segment of the compressed data file.

20. The method of claim 15, wherein the probability matrices include an initial state distribution matrix, a state transition probability matrix, and an observation probability matrix.

* * * * *